(12) United States Patent
Czubatyj

(10) Patent No.: US 7,978,508 B2
(45) Date of Patent: Jul. 12, 2011

(54) REDUCTION OF DRIFT IN PHASE-CHANGE MEMORY VIA THERMALLY-MANAGED PROGRAMMING

(75) Inventor: Wolodymyr Czubatyj, Warren, MI (US)

(73) Assignee: Ovonyx, Inc., Troy, MI (US)

( * ) Notice: Subject to any disclaimer, the term of this patent is extended or adjusted under 35 U.S.C. 154(b) by 58 days.

(21) Appl. No.: 12/356,236

(22) Filed: Jan. 20, 2009

(65) Prior Publication Data

US 2010/0182826 A1   Jul. 22, 2010

(51) Int. Cl.
*G11C 11/00* (2006.01)
(52) U.S. Cl. ............... 365/163; 365/148; 365/189.16
(58) Field of Classification Search .......... 365/163, 365/148, 189.16
See application file for complete search history.

(56) References Cited

U.S. PATENT DOCUMENTS

| 7,746,688 B2* | 6/2010 | Kim et al. ............ 365/163 |
| 2004/0228159 A1* | 11/2004 | Kostylev et al. ........ 365/148 |
| 2008/0144363 A1* | 6/2008 | Lee et al. ............. 365/163 |
| 2009/0095949 A1* | 4/2009 | Kostylev et al. ............ 257/3 |

* cited by examiner

*Primary Examiner* — Hoai V Ho
*Assistant Examiner* — Fernando N Hidalgo
(74) *Attorney, Agent, or Firm* — Kevin L. Bray

(57) ABSTRACT

A method of programming a phase-change material. The method includes providing a transformation pulse to the phase-change material, where the transformation pulse includes a programming waveform and a conditioning waveform. The programming waveform provides sufficient energy to alter the structural state of the phase-change material. In one embodiment, the programming waveform alters the volume fractions of crystalline and amorphous phase regions within the phase-change material. The conditioning waveform provides sufficient energy to heat the phase-change material to a temperature above the ambient temperature but below the crystallization temperature of the phase-change material. The method programs the phase-change material to a state that exhibits a reduced time variation of resistance.

57 Claims, 10 Drawing Sheets

PRIOR ART

REDUCTION OF DRIFT IN PHASE-CHANGE MEMORY VIA THERMALLY-MANAGED PROGRAMMING

FIELD OF INVENTION

This invention relates to the operation of programmable resistance materials. More particularly, this invention relates to a method of programming that reduces the resistance drift of phase-change memory materials. Most particularly, this invention relates to a method of programming a phase-change memory material that utilizes a programming pulse with a falling edge that is shaped to anneal the phase-change memory material.

BACKGROUND OF THE INVENTION

Programmable resistance materials are promising active materials for next-generation electronic storage and computing devices. A programmable resistance material possesses two or more states that differ in electrical resistance. The material can be programmed back and forth between the states by providing energy to induce an internal chemical, electronic, or physical transformation of the material that manifests itself as a change in resistance of the material. The different resistance states can be used as memory states to store or process data.

Phase change materials are a promising class of programmable resistance materials. A phase change material is a material that is capable of undergoing a transformation, preferably reversible, between two or more distinct structural states. The distinct structural states may be distinguished on the basis of, for example, crystal structure, atomic arrangement, order or disorder, fractional crystallinity, relative proportions of two or more different structural states, or a physical (e.g. electrical, optical, magnetic, mechanical) or chemical property. In a common embodiment, the two or more distinct structural states include differing proportions of crystalline phase regions and amorphous phase regions of the phase change material, where the phase-change material is reversibly transformable between the different states. In the crystalline state, the phase change material has lower resistivity; while in the amorphous state, it has higher resistivity. Continuous variations in resistivity over a wide range can be achieved through control of the relative proportions of crystalline phase regions and amorphous phase regions in a volume of phase-change material. Reversibility of the transformations between structural states permits reuse of the material over multiple cycles of operation.

Typically, a programmable resistance device is fabricated by placing the active programmable resistance material, such as a phase change material, between two electrodes. Operation of the device is effected by providing an electrical signal between the two electrodes and across the active material. In a common application, phase-change materials may be used as the active material of a memory device, where distinct data values are associated with the different structural states and each data value corresponds to a distinct resistance of the phase-change material. The different structural states employed in memory operation may also be referred to herein as memory states or resistance states of the phase-change material. Write operations in a phase-change memory device, which may also be referred to herein as programming operations, apply electric pulses to the phase-change material to alter its structural state to a state having the resistance associated with the intended data value. Read operations are performed by providing current or voltage signals across the two electrodes to measure the resistance. The energy of the read signal is sufficiently low to prevent disturbance of the structural state of the phase-change material.

Phase-change memory devices are normally operated in binary mode. In binary mode, the memory is operated between two structural states. To improve read margin and minimize read error, the two structural states for binary operation are selected to provide a large resistance contrast. The range of resistance values of a phase-change material is bounded by a set state having a set resistance and a reset state having a reset resistance. The set state is a low resistance structural state whose electrical properties are primarily controlled by the crystalline portion of the phase-change material and the reset state is a high resistance structural state whose electrical properties are primarily controlled by the amorphous portion of the phase-change material. The set state and reset state are most commonly employed in binary operation and may be associated with the conventional binary "0" and "1" states.

In order to expand the commercial opportunities for phase-change memory, it is desirable to identify new phase-change compositions, device structures, and methods of programming that lead to improved performance. A key performance metric for memory devices is storage density, which is a measure of the amount of information that can be stored per unit area of memory material. Miniaturization is the most common strategy for increasing storage density. By shrinking the area required to store a bit of information, more bits can be stored in a memory chip of a given size. Miniaturization has been a successful strategy for increasing storage density over the past few decades, but is becoming increasingly more difficult to employ as fundamental size limits of manufacturability are reached.

An alternative approach for increasing storage density is to increase the number of bits stored in a given area of memory. Instead of reducing the area in which information is stored, more bits of information are stored in a particular area of memory. In conventional binary operation, only a single bit of information is stored in each memory location. Higher storage density can be achieved by increasing storage capacity of each memory location. If two bits, for example, can be stored at each memory location, the storage capacity doubles without miniaturizing the memory location. In order to increase the storage capacity of each memory location, it is necessary for the memory material to be operable over more than the two states used in binary (single bit) operation. Two-bit operation, for example, requires a material that is operable over four distinguishable memory states.

Phase-change memory materials have the potential to provide multiple bit operation because of the wide resistance range that separates the set and reset states. In a typical phase-change memory device, the resistance of the set state is on the order of ~1-10 k$\Omega$, while the resistance of the reset state is on the order of ~100-1000 k$\Omega$. Since the structural states of a phase-change material are essentially continuously variable over the range of proportions of crystalline and amorphous phase volume fractions extending from the set state to the reset state, memory operation of a phase-change material at memory states having resistances intermediate between the set resistance and reset resistance is possible. As a result, multiple bit memory operation over multiple memory states is in principle achievable with phase-change memory materials.

Although phase-change memory offers the potential for multiple bit operation, progress toward achieving a practical multilevel phase-change memory has been limited. One of the practical complications associated with multilevel phase-change operation is resistance drift over time. It is common in phase-change memory devices to observe a variation in the resistance of a memory state over time. If a phase-change memory device is programmed into a particular state having a particular resistance at one time, the resistance of the device at a later time is different. As a general rule, resistance increases with time and becomes more pronounced as the amorphous phase volume fraction of a structural state increases. Resistance drift is not problematic for binary operation of phase-change memory because the set state shows little or no drift in resistance over time, while the reset state shows an increase in resistance over time. As a result, the resistance contrast between the set and reset states increases over time and no impairment of performance occurs.

Resistance drift, however, becomes problematic in multi-level applications of phase-change memory because time variations in resistance may lead to confusion in the identification of memory states. In order to advance the performance capabilities and commercial potential of phase-change memory, it is necessary develop phase-change materials, device structures or methods of operating phase-change memory devices that eliminate or minimize resistance drift.

SUMMARY OF THE INVENTION

This invention provides a method for programming phase-change memory that reduces resistance drift. The method employs a single programming pulse that includes a trailing edge that maintains the phase-change memory material at an elevated temperature for a period of time sufficient to reduce resistance drift. Under the method, the phase-change material is programmed with an electrical pulse to induce a transformation of the material to an intended memory state. The programming pulse heats the phase-change material to a temperature sufficient to induce the necessary variation in the relative proportion of crystalline and amorphous phase volume fractions of the phase-change material needed to realize the intended memory state. After the programming condition is achieved, the programming pulse includes a trailing edge that is reduced in amplitude to maintain the phase-change material at an intermediate temperature between the peak programming temperature and ambient temperature. After a period of time, the amplitude is reduced to zero and the programming operation is complete. The intermediate amplitude of the trailing edge of the programming pulse is sufficient to maintain an elevated temperature, but insufficient to induce a structural transformation. In one embodiment, the trailing edge anneals the phase-change material to relax internal stresses that may be formed therein during programming.

DETAILED DESCRIPTION OF THE ILLUSTRATED EMBODIMENTS

Figure 1:
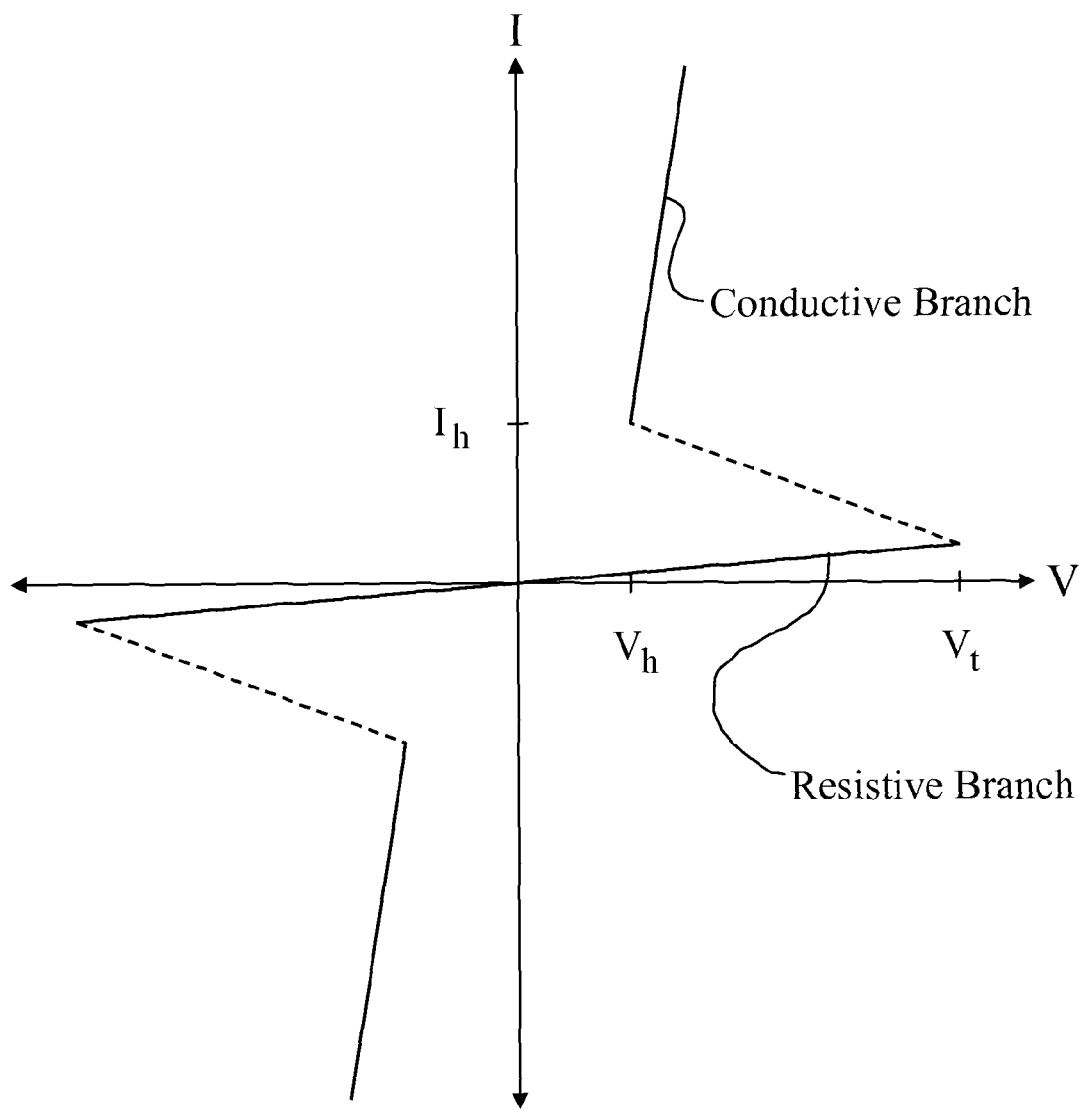
FIG. 1 is a depiction of the I-V characteristics of a chalcogenide material that exhibits an electrical switching transformation from a resistive state to a conductive state.

Although this invention will be described in terms of certain preferred embodiments, other embodiments that are apparent to those of ordinary skill in the art, including embodiments that do not provide all of the benefits and features set forth herein, are also within the scope of this invention. Accordingly, the scope of the invention is defined only by reference to the appended claims.

The instant invention is directed at enabling multilevel operation of phase-change memory devices by ameliorating the problem of resistance drift. In order to appreciate the benefits of the instant invention, it is helpful to review the basic operational characteristics of phase-change memory materials and devices and to discuss the problem of resistance drift. The following discussion focuses on chalcogenide materials as illustrative phase-change materials. The basic principles apply equally to other forms of phase-change or state-change materials, such as pnictides or other classes of materials transformable between two or more states distinguishable on the basis of structure, physical property or chemical property.

An important feature of the chalcogenide materials in the operation of chalcogenide-based phase-change memory devices and arrays is their ability to undergo a phase transformation between or among two or more structural states. The chalcogenide materials have structural states that include a crystalline state, one or more partially-crystalline states and an amorphous state. The crystalline state may be a single crystalline state or a polycrystalline state. A partially-crystalline state refers to a structural state in which a volume of chalcogenide or phase-change material includes an amorphous portion and a crystalline portion. Generally, a plurality of partially-crystalline states exists for the chalcogenide or phase-change material that may be distinguished on the basis of the relative proportion of the amorphous and crystalline portions. Fractional crystallinity is one way to characterize the structural states of a chalcogenide phase-change material. The fractional crystallinity of the crystalline state is 100%, the fractional crystallinity of the amorphous state is 0%, and the fractional crystallinities of the partially-crystalline states may vary continuously between 0% (the amorphous limit) and 100% (the crystalline limit). Phase-change chalcogenide materials are thus able to transform among a plurality of structural states that vary inclusively between fractional crystallinities of 0% and 100%.

Transformations among the structural states are induced by providing energy to the chalcogenide material. Energy in various forms can induce structural transformations of the crystalline and amorphous portions and thus can influence the fractional crystallinity of a chalcogenide material. Suitable forms of energy include one or more of electrical energy, thermal energy, optical energy or other forms of energy (e.g. particle-beam energy) that induce electrical, thermal or optical effects in a chalcogenide material. Continuous and reversible variability of the fractional crystallinity is achievable by controlling the energy environment of a chalcogenide material. A crystalline state can be transformed to a partially-crystalline or an amorphous state, a partially-crystalline state can be transformed to a crystalline, amorphous or different partially-crystalline state, and an amorphous state can be transformed to a partially-crystalline or crystalline state through proper control of the energy environment of a chalcogenide material. Some considerations associated with the use of thermal, electrical and optical energy to induce structural transformations are presented in the following discussion.

The use of thermal energy to induce structural transformations exploits the thermodynamics and kinetics associated with the crystalline to amorphous or amorphous to crystalline phase transitions. An amorphous phase may be formed, for example, from a partially-crystalline or crystalline state by heating a chalcogenide material above its melting temperature and cooling at a rate sufficient to inhibit the formation of crystalline phases. A crystalline phase may be formed from an amorphous or partially-crystalline state, for example, by heating a chalcogenide material above the crystallization temperature for a sufficient period of time to effect nucleation and/or growth of crystalline domains. The crystallization temperature is below the melting temperature and corresponds to the minimum temperature at which crystallization may occur. The driving force for crystallization is typically thermodynamic in that the free energy of a crystalline or partially-crystalline state in many chalcogenide materials is lower than the free energy of an amorphous state so that the overall energy of a chalcogenide material decreases as the fractional crystallinity increases. Formation (nucleation and growth) of a crystalline state or crystalline domains within a partially-crystalline or amorphous state is kinetically enabled up to the melting temperature, so that heating promotes crystallization by providing energy that facilitates the rearrangements of atoms needed to form a crystalline phase or domain. The fractional crystallinity of a partially-crystalline state can be controlled by controlling the temperature or time of heating of the partially-crystalline state or by controlling the temperature or rate of cooling of an amorphous or partially-crystalline state. Through proper control of the peak temperature, time of heating and rate of cooling, structural states over the full range of fractional crystallinity can be achieved for the chalcogenide phase-change materials.

The use of electrical energy to induce structural transformations relies on the application of electrical (current or voltage) pulses to a chalcogenide material. The mechanism of electrically-induced structural transformations includes Joule heating created by resistance to current flow. Joule heating corresponds to a conversion of electrical energy to thermal energy and leads to an increase in the temperature of the chalcogenide material. By controlling the current density, the temperature can be controlled.

The crystalline phase portions of a chalcogenide material are sufficiently conductive to permit current densities that provide efficient Joule heating. The amorphous phase portions, however, are much less conductive and ordinarily would not support current densities sufficient to heat the material to the crystallization temperature. As described more fully hereinbelow, however, the amorphous phase of many chalcogenide materials can be electrically switched to a highly conductive intermediate state upon application of a voltage greater than the threshold voltage. In the intermediate state, the material can support a current density that is high enough to heat the material to the crystallization temperature through Joule heating. By controlling the magnitude and/or duration of electrical pulses applied to a chalcogenide phase-change material, it is possible to vary continuously the fractional crystallinity through controlled interconversion of the crystalline and amorphous phases.

The influence of electrical energy on a chalcogenide material is generally depicted in terms of the I-V (current-voltage) and R-I (resistance-current) relationships of the material. The I-V relationship shows the current response of a chalcogenide material as a function of applied voltage and the R-I relationship shows the variation of the electrical resistance of a chalcogenide material as a function of the amount of electrical energy provided or as a function of the magnitude of the current or voltage pulse applied to a chalcogenide material. A brief discussion of the I-V and R-I characteristics of chalcogenide materials follows.

The I-V response of many chalcogenide materials exhibits an electrical switching event in which the chalcogenide material undergoes a transformation from a more resistive state to a more conductive state. A schematic depiction of the electrical switching event is presented in FIG. 1. The depiction of FIG. 1 corresponds to a two-terminal device configuration in which two spacedly disposed electrodes are in contact with a chalcogenide material and the current I corresponds to the current passing between the two electrodes. The I-V curve of FIG. 1 shows the current passing through the chalcogenide material as a function of the voltage applied across the material by the electrodes. The I-V characteristics of the material are symmetric with respect to the polarity of the applied voltage. For convenience, we consider the first quadrant of the I-V plot of FIG. 1 (the portion in which current and voltage are both positive) in the discussion of chalcogenide switching behavior that follows. An analogous description that accounts for polarity applies to the third quadrant of the I-V plot.

The I-V curve includes a resistive branch and a conductive branch. The branches are labeled in FIG. 1. The resistive branch corresponds to the regime in which the current passing through the material is a weak function of the applied voltage across the material. This branch exhibits a small slope in the I-V plot and appears as a nearly horizontal line in the first and third quadrants of FIG. 1. The conductive branch corresponds to the regime in which the current passing through the material is highly sensitive to the voltage applied across the material. This branch exhibits a large slope in the I-V plot and appears as a nearly vertical line in the first and third quadrants of FIG. 1. The slopes of the resistive and conductive branches shown in FIG. 1 are illustrative and not intended to be limiting, the actual slopes will depend on the chemical composition of the chalcogenide material, device geometry, circuit configuration, and electrical contacts. Regardless of the actual slopes, the conductive branch exhibits a larger slope than the resistive branch. When device conditions are such that the chalcogenide material is described by a point on the resistive branch of the I-V curve, the chalcogenide material or device may be said to be in a resistive state. When device conditions are such that the chalcogenide material is described by a point on the conductive branch of the I-V curve, the chalcogenide material or device may be said to be in a conductive state.

The switching properties of the chalcogenide material are shown in FIG. 1. We begin with a device that has no voltage applied across it. When no voltage is applied across the chalcogenide material, the material is in a resistive state and no current flows. This condition corresponds to the origin of the I-V plot shown in FIG. 1. The chalcogenide material remains in a resistive state as the applied voltage is increased, up to a threshold voltage (labeled $V_t$ in the first quadrant of FIG. 1). The slope of the I-V curve for applied voltages between 0 and $V_t$ is small in magnitude and indicates that the chalcogenide material has a high electrical resistance. The high resistance implies low electrical conductivity and as a result, the current flowing through the material increases only weakly as the applied voltage is increased. Since the current through the material is very small, the resistive state of the chalcogenide may be referred to as the OFF state of the material. In the conductive "ON" state, the IV does not exhibit a threshold voltage, but goes directly from a more conducting state into the dynamic state with no need to threshold.

When the applied voltage equals or exceeds the threshold voltage, the chalcogenide material transforms (switches) from the resistive branch to the conductive branch of the I-V curve. The switching event occurs essentially instantaneously and is depicted by the dashed line in FIG. 1. Upon switching, the device voltage decreases significantly and the device current becomes much more sensitive to changes in the device voltage. The chalcogenide material remains in the conductive branch as long as a minimum current, labeled $I_h$ in FIG. 1, is maintained. We refer to $I_h$ as the holding current and the associated voltage $V_h$ as the holding voltage of the device. If the device conditions are changed so that the current becomes less than $I_h$, the material normally returns to the resistive branch of the I-V plot and requires subsequent application of a threshold voltage to resume operation on the conductive branch. If the current is only momentarily (a time less than the recovery time of the chalcogenide material) reduced below $I_h$, the conductive state of the chalcogenide material may be recovered upon restoring the current to or above $I_h$. The recovery time of chalcogenide materials has been discussed in the article "Amorphous Semiconductors for Switching, Memory, and Imaging Applications", IEEE Transactions on Electron Devices, vol. ED-20, p. 91-105 (1973) by S. R. Ovshinsky and H. Fritzsche; the disclosure of which is incorporated by reference herein.

The switching effect of the instant devices originates from a transformation of the chalcogenide material from a resistive state to a conductive state upon application of a threshold voltage, $V_{th}$. According to one model of the switching transformation, application of the threshold voltage causes the formation of a conductive channel or filament within the chalcogenide material. At the threshold voltage, the electric field experienced by the material is sufficiently high to induce a breakdown or avalanche effect whereby electrons are removed from atoms to form a highly conductive, plasma-like filament of charge carriers. Rather than being bound to atoms, some electrons become unbound and highly mobile. As a result, a conductive channel or filament forms. The conductive filament constitutes a conductive volume within the otherwise resistive chalcogenide material. The conductive filament extends through the chalcogenide material between the device terminals and provides a low resistance pathway for electrical current. Portions of the chalcogenide material outside of the filament remain resistive. Since electric current traverses the path of least resistance, the presence of a conductive filament renders the chalcogenide material conductive and establishes a conductive state. The creation of a conductive filament is the event that underlies the switching of the chalcogenide material from a resistive state to a conductive state.

The conductive filament is maintained between the device terminals as long as the device current remains at or above the holding current. A conductive filament is present for all points along the conductive branch, but the cross sectional area of the filament differs for different points along the conductive branch. Depending on operating conditions within the conductive branch, the filament can be narrow or wide. As the applied voltage is increased along the conductive branch, the cross section of the filament is enlarged as the applied voltage is increased. The enlarged filament indicates a greater volume of the chalcogenide material exhibits high conductivity. During the time the filament enlarges, the voltage across the contacts remains constant. When the filament reaches the dimensions of the pore, it can no longer grow and its resistivity must increase. As a result, the chalcogenide material can support a greater current, as indicated by the conductive branch of the I-V curve, when the applied voltage increases. Variations of the voltage applied to a chalcogenide material operating in the conductive branch modify the width or thickness of the filament in directions lateral to the direction of current flow. The net effect of varying the applied voltage of a chalcogenide material operating in the conductive branch is to modify the volume fractions of the conductive and resistive portions (unless the material is melted and quenched).

Chalcogenide materials of many chemical compositions undergo the foregoing switching effect. Representative chalcogenide materials are those that include one or more elements from column VI of the periodic table (the chalcogen elements) and optionally one or more chemical modifiers from columns III, IV or V. One or more of S, Se, and Te are the most common chalcogen elements included in the active material of the instant devices. The chalcogen elements are characterized by divalent bonding and the presence of lone pair electrons. The divalent bonding leads to the formation of chain and ring structures upon combining chalcogen elements to form chalcogenide materials and the lone pair electrons provide a source of electrons for forming a conducting filament. Trivalent and tetravalent modifiers such as Al, Ga, In, Ge, Sn, Si, P, As and Sb enter the chain and ring structures of chalcogen elements and provide points for branching and crosslinking. The structural rigidity of chalcogenide materials depends on the extent of crosslinking and leads to a broad classification of chalcogenide materials, according to their ability to undergo crystallization or other structural rearrangements, into one of two types: threshold switching materials and phase-change (or memory) materials.

Both types of chalcogenide materials display the switching behavior shown in FIG. 1, but differ in their structural response to filament formation. The threshold switching materials generally possess a higher concentration of modifiers and are more highly crosslinked than the phase-change materials. They are accordingly more rigid structurally. Threshold switching materials are amorphous and show little or no tendency to crystallize because the atomic rearrangements required to nucleate and grow a crystalline phase are inhibited by the rigidity of the structure. Threshold switching materials do not undergo a crystallization transformation during switching and remain amorphous upon removing the applied voltage after switching.

Phase-change chalcogenide materials, on the contrary, are lightly crosslinked and more easily undergo full or partial crystallization. An amorphous phase-change material undergoes filament formation in the presence of a threshold voltage as described in FIG. 1 hereinabove. Once in the conductive branch, however, the phase-change material may undergo nucleation and growth of a crystalline phase. The volume fraction of the crystalline phase depends on the magnitude and time of the current passing through the phase-change material. If formed, the crystalline phase is retained upon removing the applied voltage after switching. Through appropriate selection of device operating conditions, the amorphous-crystalline transformation of chalcogenide phase-change memory materials becomes reversible over many cycles. Chalcogenide memory materials have been discussed in U.S. Pat. Nos. 5,166,758; 5,296,716; 5,534,711; 5,536,947; 5,596,522; and 6,087,674; the disclosures of which are hereby incorporated by reference.

Figure 2:
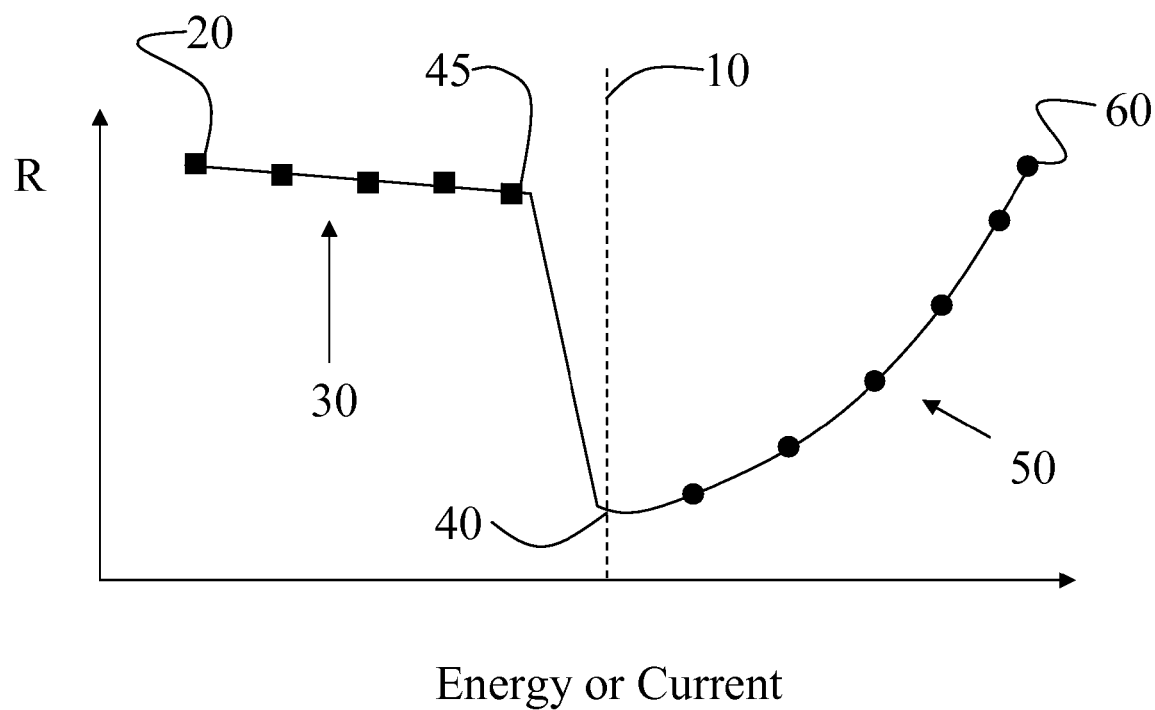
FIG. 2 is an illustrative Resistance vs. Energy/Current plot for a chalcogenide phase-change material.

The R-I response is a meaningful depiction of the characteristics of the chalcogenide phase-change materials and provides a representation of the effect of structural transformations associated with the crystalline-amorphous phase-change process on electrical properties. A representative depiction of the electrical resistance (R) of a chalcogenide material as a function of electrical energy or current pulse magnitude (Energy/Current) is presented in FIG. 2. FIG. 2 may generally be referred to as a resistance plot.

The resistance plot includes two characteristic response regimes of a chalcogenide material to electrical energy. The regimes are approximately demarcated with the vertical dashed line 10 shown in FIG. 2. The regime to the left of the line 10 may be referred to as the accumulating regime of the chalcogenide material. The accumulation regime is distinguished by a nearly constant or gradually varying electrical resistance with increasing electrical energy until a highly conducting state is reached. In most cases there is a region where device temperatures favor crystalline growth and when a percolation path occurs the resistance drop is very pronounced. The accumulation regime thus extends, in the direction of increasing energy, from the leftmost point 20 of the resistance plot, through a plateau region (generally depicted by 30) corresponding to the range of points over which the resistance variation is small or gradual to the set point or state 40 that follows an abrupt decrease in electrical resistance. The plateau 30 may be horizontal or sloping.

The left side of the resistance plot is referred to as the accumulating regime because the structural state of the chalcogenide material cumulatively evolves as energy is applied. The fractional crystallinity of the structural state correlates with the total accumulation of applied energy. The leftmost point 20 corresponds to the structural state in the accumulating regime having the lowest fractional crystallinity and may be referred to as the reset state. This state may be fully amorphous or may be primarily amorphous with some degree of crystalline content. As energy is added, the chalcogenide material progresses among a plurality of partially-crystalline states with increasing fractional crystallinity along the plateau 30. Selected accumulation states (structural states in the accumulation region) are marked with squares in FIG. 2.

Upon accumulation of a sufficient amount of applied energy, the fractional crystallinity of the chalcogenide material increases sufficiently to effect a setting transformation characterized by a dramatic decrease in electrical resistance and stabilization of the set state 40. The structural states in the accumulation regime may be referred to as accumulation states of the chalcogenide material. Structural transformations in the accumulating regime are unidirectional in the sense that they progress in the direction of increasing applied energy within the plateau region 30 and are reversible only by first driving the chalcogenide material through the set point 40 and resetting (melting and quenching the device). Once the reset state is obtained, lower amplitude current pulses can be applied and the accumulation response of the chalcogenide material can be retraced. It is possible to reversibly transform between the set and reset states over multiple cycles of operation.

While not wishing to be bound by theory, the instant inventor believes that the addition of energy to a chalcogenide material in the accumulating regime leads to an increase in fractional crystallinity through the nucleation of new crystalline domains or growth of existing crystalline domains or a combination thereof. It is believed that the electrical resistance varies only gradually along the plateau 30 despite the increase in fractional crystallinity because the crystalline domains form or grow in relative isolation of each other so as to prevent the formation of a contiguous crystalline network that spans the chalcogenide material between the two device electrodes. This type of crystallization may be referred to as sub-percolation crystallization. The setting transformation coincides with a percolation threshold in which a contiguous, interconnected crystalline network forms within the chalcogenide material that bridges the space between the two electrodes of the device. Such a network may form, for example, when crystalline domains increase sufficiently in size to impinge upon neighboring domains. Since the crystalline phase of chalcogenide materials is more conductive and less resistive than the amorphous phase, the percolation threshold corresponds to the formation of a contiguous low resistance conductive pathway through the chalcogenide material. As a result, the percolation threshold is marked by a dramatic decrease in the resistance of the chalcogenide material. The leftmost point 20 of the accumulation regime may be an amorphous state or a partially-crystalline state lacking a contiguous crystalline network. Sub-percolation crystallization commences with an initial amorphous or partially-crystalline state and progresses through a plurality of partially-crystalline states having increasingly higher fractional crystallinities until the percolation threshold is reached and the setting transformation occurs.

The regime to the right of the line 10 of FIG. 2 may be referred to as the direct overwrite regime. The direct overwrite regime extends from the set state 40 through a plurality of intermediate states (generally depicted by 50) to a reset point or state 60. The various points in the direct overwrite regime may be referred to as direct overwrite states of the chalcogenide material. Selected direct overwrite states are marked with circles in FIG. 2. Structural transformations in the direct overwrite regime may be induced by applying an electric current or voltage pulse to a chalcogenide material. In FIG. 2, an electric current pulse is indicated. In the direct overwrite regime, the resistance of the chalcogenide material varies with the magnitude of the applied electric pulse. The resistance of a particular direct overwrite state is characteristic of the structural state of the chalcogenide material, and the structural state of a chalcogenide material is dictated by the magnitude of the applied current pulse. The fractional crystallinity of the chalcogenide material decreases as the magnitude of the current pulse increases. The fractional crystallinity is highest for direct overwrite states at or near the set point 40 and progressively decreases as the reset state 60 is approached. The chalcogenide material transforms from a structural state possessing a contiguous crystalline network at the set state 40 to a structural state that is amorphous or substantially amorphous or partially-crystalline without a contiguous crystalline network at the reset state 60. The application of current pulses having increasing magnitude has the effect of converting portions of the crystalline network into an amorphous phase and ultimately leads to a disruption or interruption of contiguous high-conductivity crystalline pathways in the chalcogenide material. As a result, the resistance of the chalcogenide material increases as the magnitude of an applied current pulse increases in the direct overwrite region.

In contrast to the accumulating region, structural transformations that occur in the direct overwrite region are reversible and bi-directional. As indicated hereinabove, each state in the direct overwrite region may be identified by its resistance and an associated current pulse magnitude, where application of the associated current pulse magnitude induces changes in fractional crystallinity that produce the particular resistance state. Application of a subsequent current pulse may increase or decrease the fractional crystallinity of an existing resistance state of the chalcogenide material. If the subsequent current pulse has a higher magnitude than the pulse used to establish the existing state, the fractional crystallinity of the chalcogenide material decreases and the structural state is transformed from the existing state in the direction of the reset state along the direct overwrite resistance curve. Similarly, if the subsequent current pulse has a lower magnitude than the pulse used to establish the existing state, the fractional crystallinity of the chalcogenide material increases and the structural state is transformed from the existing state in the direction of the set state along the direct overwrite resistance curve.

The direct overwrite states of the chalcogenide material may be used to define memory states of a memory device. Most commonly, the memory devices are binary memory devices that utilize two of the direct overwrite states as memory states, where a distinct data value (e.g. "0" or "1") is associated with each state. Each memory state thus corresponds to a distinct structural state of the chalcogenide material and readout or identification of the state can be accomplished by measuring the resistance of the material (or device) since each structural state is characterized by a distinct resistance value. The operation of transforming a chalcogenide material to the structural state associated with a particular memory state may be referred to herein as programming the chalcogenide material, writing to the chalcogenide material or storing information in the chalcogenide material.

To facilitate readout and to minimize readout error, it is desirable to select the memory states of a binary memory device so that the contrast in resistance of the two states is large. Typically the set state (or a state near the set state) and the reset state (or a state near the reset state) are selected as memory states in a binary memory application. The resistance contrast depends on details such as the chemical composition of the chalcogenide, the thickness of the chalcogenide material in the device and the geometry of the device. For a layer of phase-change material having the composition $Ge_{22}Sb_{22}Te_{56}$, a thickness of ~600 Å, and pore diameter of below ~0.1 μm in a typical two-terminal device structure, for example, the resistance of the reset state is ~100-1000 kΩ and the resistance of the set state is under ~10 kΩ. Phase-change materials in general show resistances in the range of ~100 kΩ to ~1000 kΩ in the reset state and resistance of ~0.5 kΩ to ~50 kΩ in the set state. In the preferred phase-change materials, the resistance of the reset state is at least a factor of two, and more typically an order of magnitude or more, greater than the resistance of the set state.

Figure 3:
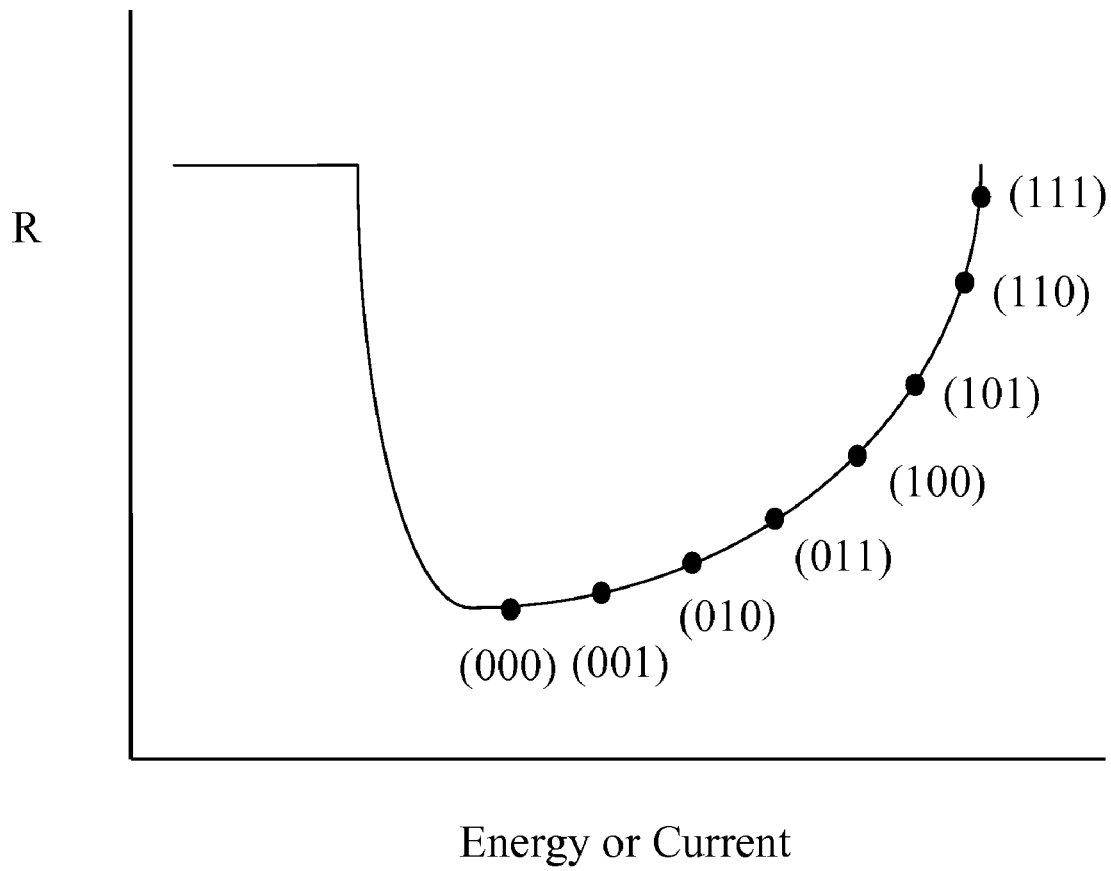
FIG. 3 depicts an assignment of resistance values to memory states of a multilevel memory device.

This invention seeks to extend the applicability of chalcogenide or phase-change materials beyond binary (single bit) memory applications to multilevel (non-binary or multiple bit) memory applications. The storage density of a multilevel chalcogenide or phase-change memory device improves as the number of memory states increases. As described hereinabove, the direct overwrite region of the resistance plot of a chalcogenide or phase-change material includes a plurality of states that differ in resistance over a resistance interval extending from the set state to the reset state. Multilevel memory operation can be achieved by selecting three or more states from among the direct overwrite states and associating a unique data value with each. Each of the three or more states corresponds to a distinct structural state of the chalcogenide and is characterized by a distinct resistance value. Two bit operation can be achieved by selecting four direct overwrite states to serve as memory states, three bit operation can be achieved by selecting eight direct overwrite states to serve as memory states, etc. FIG. 3 shows an illustrative selection of eight direct overwrite states for use as memory states in a three-bit memory device. One assignment of data values to the different states is also shown, where the (000) state corresponds to the set state, the (111) state corresponds to the reset state, and a series of intermediate resistance states is included.

To improve the storage density in a multilevel memory device, it is desirable to operate the memory material over as many states as possible. The number of memory states is controlled by the resistance interval between the set state and reset state, the resolution limit of the resistance measurement performed during the read operation, and the stability of the resistance values. A large resistance difference between the set and reset states provides a wide dynamic range of resistance over which operation of the memory device can occur. The resolution limit of the read resistance measurement imposes a practical limit on the spacing of resistance values associated with the different memory states. The resolution limit depends on read noise and instrumental limitations. The resistance differential between adjacent memory states must be greater than the resolution of the read resistance measurement. Stable resistance values are needed to insure that programmed resistance values do not vary in time.

In current chalcogenide phase-change memory devices, the resistance contrast between the set and reset states is large (at least an order of magnitude) and the resolution of a resistance measurement is on the order of a few or so percent of the measured resistance value. The primary practical limitation in achieving reliable multilevel operation today is variability in the resistance of the memory states over time. Time variability of resistance may be referred to herein as "resistance drift" or "drift". Drift is a common occurrence in chalcogenide phase-change materials and causes the resistance of the material to deviate from its programmed value. As indicated hereinabove, storing data in a chalcogenide memory device occurs by using energy to program the chalcogenide memory material to the structural state associated with the data value. The resistance of the structural state is a representation of the data value and different data values are distinguished on the basis of resistance. When drift occurs, the programmed resistance deviates over time from its initial value. As a result, when the memory device is read at a later time, the resistance differs from the intended value and a misread of information may occur. The variation in resistance over time is spontaneous and occurs in the absence of any post-programming electrical stimulation.

Experimentally, drift normally leads to an increase in resistance over time. The variation of resistance with time is commonly modeled empirically with the following power law relation:

$$R(t) = R_0 t^d$$

where R(t) is the resistance at time t, $R_0$ is the initial (programmed) resistance (measured in practice at a time of 1 second following the programming pulse), t is time, and d is the drift exponent (which may also be referred to herein as a drift coefficient).

Figure 4:
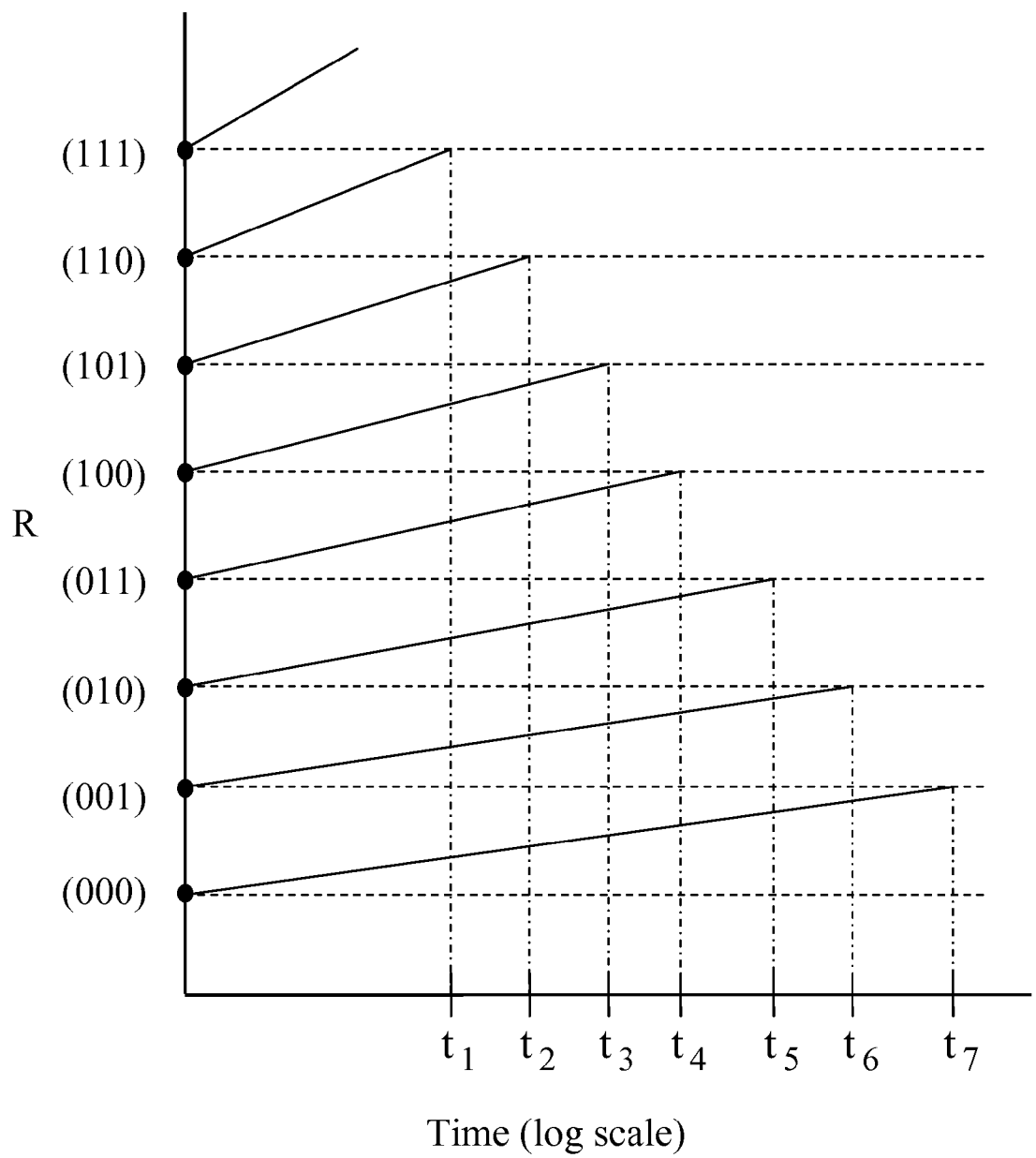
FIG. 4 is a schematic depiction of resistance drift for memory states of a multilevel memory device.

FIG. 4 shows a schematic depiction of resistance drift for the eight states identified in the three-bit memory device of FIG. 3. The initial (programmed) resistance of each state is plotted on the ordinate axis and a representation of the evolution of the resistance of each state with time is shown. The time axis is presented on a logarithmic scale and the resistance drift for each state is shown as a linear relation in accordance with the power law form presented above. The slope (drift exponent) of the power law has been arbitrarily selected for each of the states for illustration purposes. In the depiction shown in FIG. 4, the drift exponent has been chosen to be higher for higher resistance states than for lower resistance states.

The negative ramifications of drift for multilevel memory devices can be understood from FIG. 4. If the initial resistance of a particular programmed memory state drifts sufficiently to coincide with the resistance of a different memory state, a read of the resistance provides a false indication of the data value stored in the device. Suppose, for example, that the resistance of the (000) state shown in FIG. 4 is 5 kΩ and that the remaining states are spaced apart by 50 kΩ intervals so that the resistance of state (001) is 55 kΩ, the resistance of state (010) is 105 kΩ etc. If the material is programmed into a particular memory state and the resistance of that state drifts by 50 kΩ, a read of the resistance of the state provides a result that indicates that the device is in a memory state adjacent to the one in which the device was programmed. In the example of FIG. 4, the resistance of the (110) state drifts upward in resistance by 50 kΩ at time $t_1$. If the device is read at time $t_1$, the measured resistance corresponds to the resistance of the (111) and leads the operator to erroneously conclude that the (111) data value was stored in the device instead of the (110) data value. Similar errors in determining the programmed data value occur for state (101) at time $t_2$, state (100) at time $t_3$, etc. Depending on the time elapsed since programming and the drift coefficient, the resistance of a particular programmed state may drift beyond the adjacent memory state to higher memory states.

In the case of a binary memory, where the set state ((000)) and reset state ((111)) are selected as the memory state, drift presents no practical difficulty because the drift exponent of the set state is either non-existent or so small as to preclude the possibility of confusing the (000) state with the (111) state. As the number of memory states increases and the resistance interval between states decreases, however, drift becomes of great practical concern.

Figure 5:
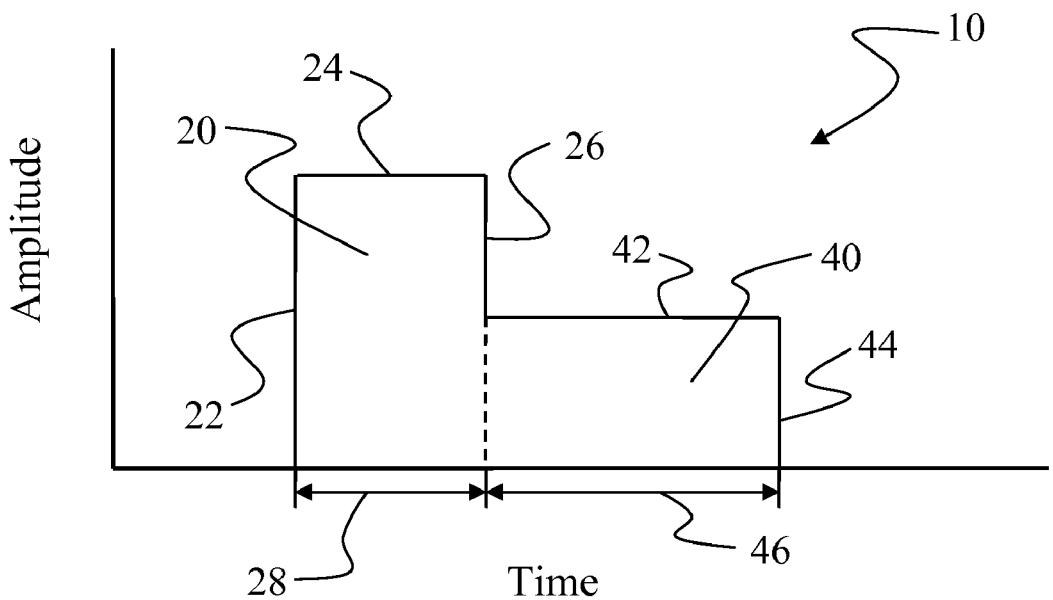
FIG. 5 depicts a transformation pulse that includes a programming waveform and a conditioning waveform.
Figure 6:
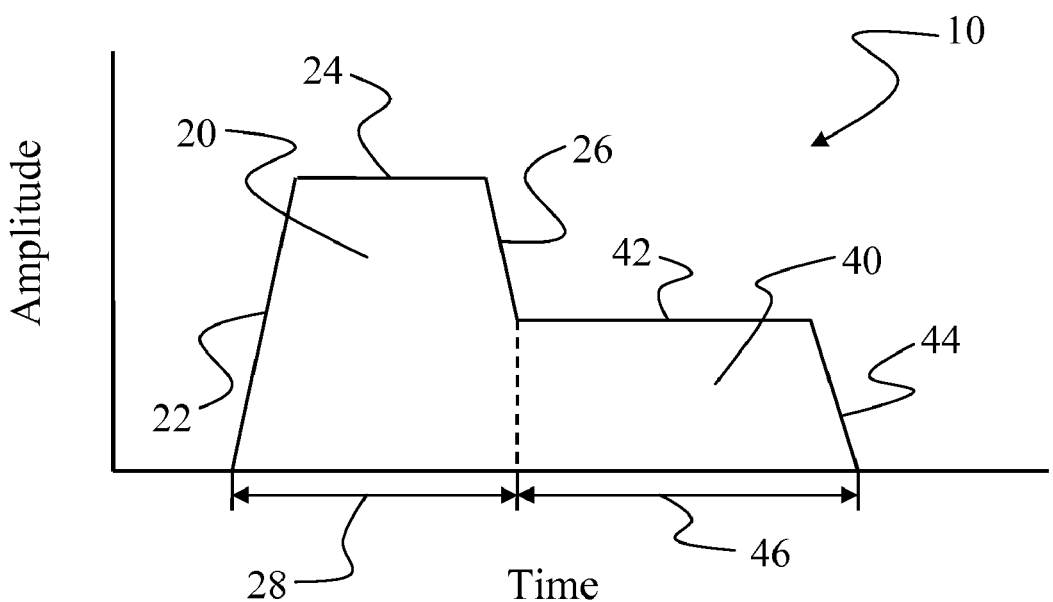
FIG. 6 depicts a transformation pulse that includes a programming waveform and a conditioning waveform.
Figure 7:
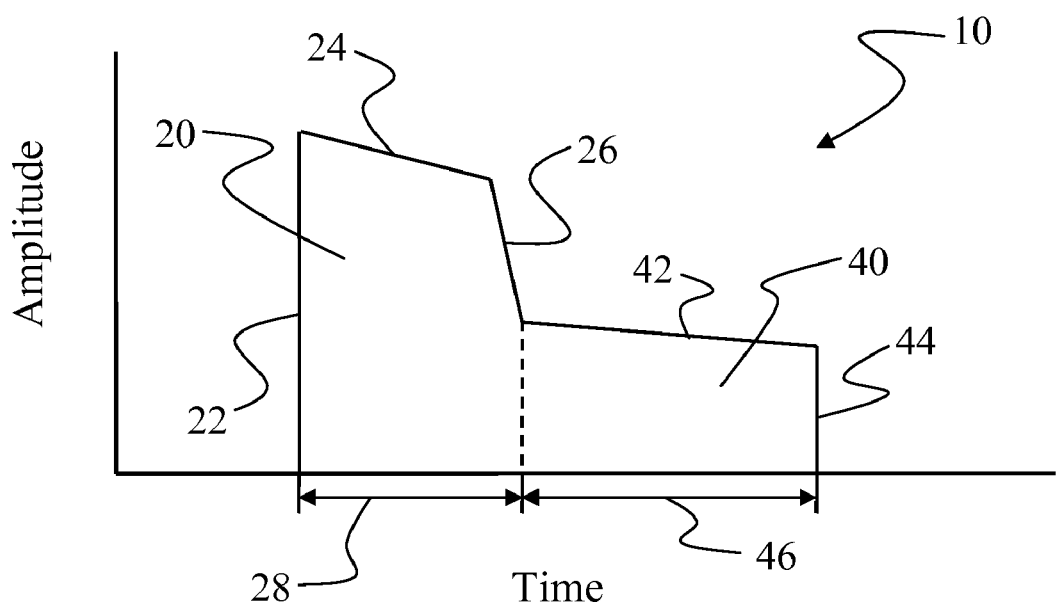
FIG. 7 depicts a transformation pulse that includes a programming waveform and a conditioning waveform.
Figure 8:
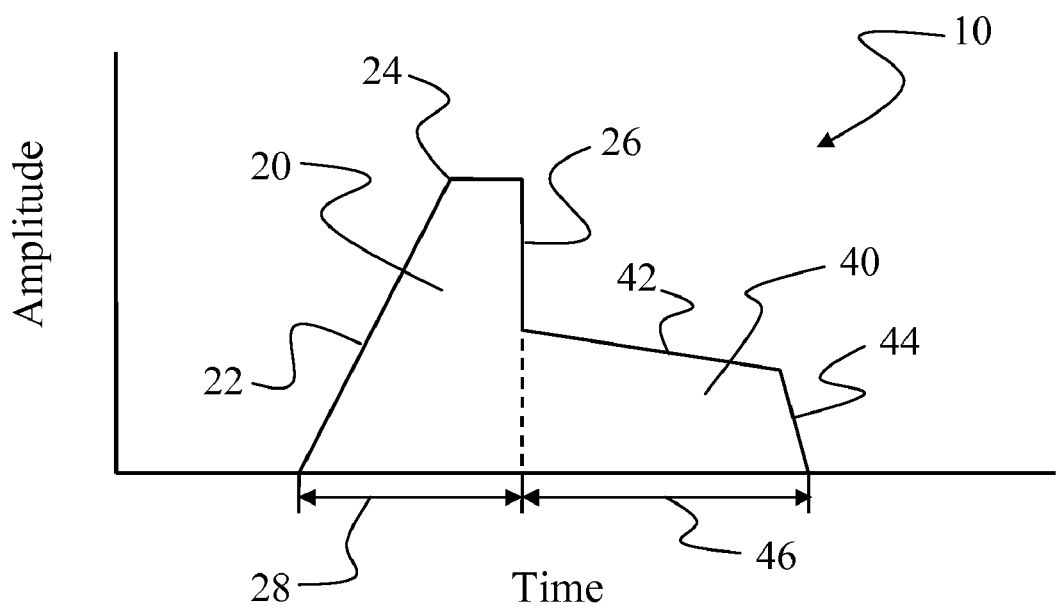
FIG. 8 depicts a transformation pulse that includes a programming waveform and a conditioning waveform.

The instant programming method alleviates the problem of resistance drift and furthers the goal of achieving multilevel chalcogenide or phase-change memory devices. The method includes providing a composite transformation pulse to the chalcogenide or phase-change memory material. The transformation pulse includes a programming waveform and a conditioning waveform, where the programming waveform has a higher (current or voltage) amplitude than the conditioning waveform. A depiction of a transformation pulse in accordance with the instant invention is shown in FIG. 5. Transformation pulse 10 includes programming waveform 20 and conditioning waveform 40. Programming waveform 20 includes leading edge 22, first plateau 24, first trailing edge 26, and persists over first time window 28. Conditioning waveform 40 includes second plateau 42, second trailing edge 44, and persists over second time window 46. Although the programming waveform and conditioning waveform are depicted as generally square in shape, the instant invention extends generally to other pulse shapes. Leading edge 22, first trailing edge 26, and second trailing edge 44, for example, may also be sloped. One or more of the slopes may be the same or all of the slopes may be different. First plateau 24 and second plateau 42 may persist for an extended period of time or may be only momentary in time (where, for example, either or both of first plateau 24 and second plateau 42 may correspond to a unitary peak). First plateau 24 and/or second plateau 42 may also be sloped. Additional illustrative, but non-limiting, examples of transformation pulses in accordance with the instant invention are shown in FIGS. 6-8. A waveform having an essentially vertical leading edge and an essentially vertical trailing edge separated by a horizontal plateau may be referred to herein as a square waveform. Programming waveform 20 and conditioning waveform 40 shown in FIG. 5 are examples of square waveforms. A waveform having at least one of a sloped leading edge, a sloped trailing edge, or a sloped plateau may be referred to herein as a trapezoidal waveform. Programming waveform 20 and conditioning waveform 40 shown in FIG. 6 are examples of trapezoidal waveforms.

In the transformation pulse, the programming waveform precedes the conditioning waveform so that the chalcogenide or phase-change memory material experiences programming waveform 20 before conditioning waveform 40. The amplitude of the programming window is sufficiently high to induce a structural transformation of the chalcogenide or phase-change memory. In one embodiment, the amplitude of the programming waveform is sufficient to establish a temperature of at least the crystallization temperature within the chalcogenide or phase-change material. In another embodiment, the amplitude of the programming waveform is sufficient to establish a temperature of at least the melting temperature within the chalcogenide or phase-change material. The programming waveform can thus induce crystallization or amorphization of the chalcogenide or phase-change material. Adjustment of first time window 28 and/or the slope of first trailing edge 26 permit control over the volume fraction of phase-change material that is transformed through a crystallization or amorphization process.

Conditioning waveform 40 is not intended to alter the structural state of the phase-change material. Accordingly, the amplitude of conditioning waveform 40 is insufficient to maintain or establish a temperature at or above the crystallization temperature of the phase-change material. Conditioning waveform 40 does, however, provide sufficient energy to the phase-change material to maintain it at an elevated temperature, where the elevated temperature is a temperature above ambient temperature and below the crystallization temperature of the phase-change material. Conditioning waveform 40 is intended to ameliorate resistance drift by remedying time-dependent phenomena that may occur in a phase-change material after inducement of a structural transformation by programming waveform 20. As noted hereinabove, resistance drift corresponds to a time variation in resistance. While not wishing to be bound by theory, the instant inventor believes that maintaining the phase-change material at an elevated temperature (unaccompanied by a structural transformation) has the effect of relieving or accelerating time-dependent phenomena that may contribute to resistance variation over time.

In one model, relaxation of stresses in the phase-change material over time is believed to be a contributing factor to resistance drift. In this model, it is believed that transformations from the crystalline state to the amorphous state (or vice versa) produce internal stresses in the phase-change material. The internal stresses may, for example, arise at the interface between crystalline and amorphous domains. The internal stresses may also arise internally within the crystalline or amorphous domains. The internal stresses are expected to be greatest immediately following a structural transformation and are expected to diminish over time as the material relaxes toward an equilibrium state. In this model, the resistance of the phase-change material is a function of the state of internal stress and variations in the internal stress with time lead to drift. In the context of this model, the elevated temperature maintained by conditioning waveform 40 accelerates the relaxation of internal stresses so that upon conclusion of conditioning waveform 40, the phase-change material is in a more time-stable state that exhibits a lesser degree of resistance drift. In one embodiment, conditioning waveform 40 anneals the phase-change material and thereby relaxes internal stresses (or other time-dependent effects that contribute to resistance drift).

The internal stress model of resistance drift is consistent with certain aspects of programming a phase-change material. As indicated hereinabove, resistance drift generally becomes more pronounced as the amorphous phase volume fraction of the phase-change material increases. Formation of an amorphous phase requires a programming waveform having an amplitude sufficient to melt the phase-change material and a first trailing edge 26 that is sufficiently abrupt to quench the molten state. Quenching establishes an amorphous phase and needs to occur on a timescale sufficiently short to permit crystallization. The quenching process is inherently non-equilibrium in nature and consistent with establishing an amorphous state that is not fully relaxed. As the amorphous phase volume fraction increases, the degree to which the phase-change material is in a non-equilibrium state increases. As a result, higher or more pervasive internal stresses and a greater tendency for resistance drift are expected as the amorphous phase volume fraction increases.

The duration of conditioning waveform 40 is generally longer than the duration of programming waveform 20. As noted above, resistance drift is more pronounced in states having a higher amorphous phase volume fraction. Such states are created through a melt-quench process that requires fast cooling to preserve the amorphous state and avoid crystallization. The duration of first trailing edge 26 is typically on the order of tens of nanoseconds to insure proper quenching. The duration of conditioning waveform 40 corresponds to second time window 46 depicted in FIGS. 5-8 and has a value in the range from several tens of nanoseconds to several microseconds. In one embodiment, the duration of conditioning waveform 40 is between 50 nanoseconds and 10 microseconds. In another embodiment, the duration of conditioning waveform 40 is between 200 nanoseconds and 5 microseconds. In still another embodiment, the duration of conditioning waveform 40 is between 500 nanoseconds and 2 microseconds.

Programming waveform 20 ends upon conclusion of first trailing edge 26. Conditioning waveform 40 consecutively follows programming waveform 20 in time. In particular, conditioning waveform 40 initiates while first trailing edge 26 has a non-zero amplitude so that no period of time between programming waveform 20 and conditioning waveform 40 occurs over which the phase-change material experiences a zero amplitude pulse condition. Conditioning waveform 40 does not follow a relaxation of first trailing edge 26 to zero amplitude, but rather is applied to insure that the phase-change material does not return to a state of zero amplitude after application of programming waveform 20.

Figure 9:
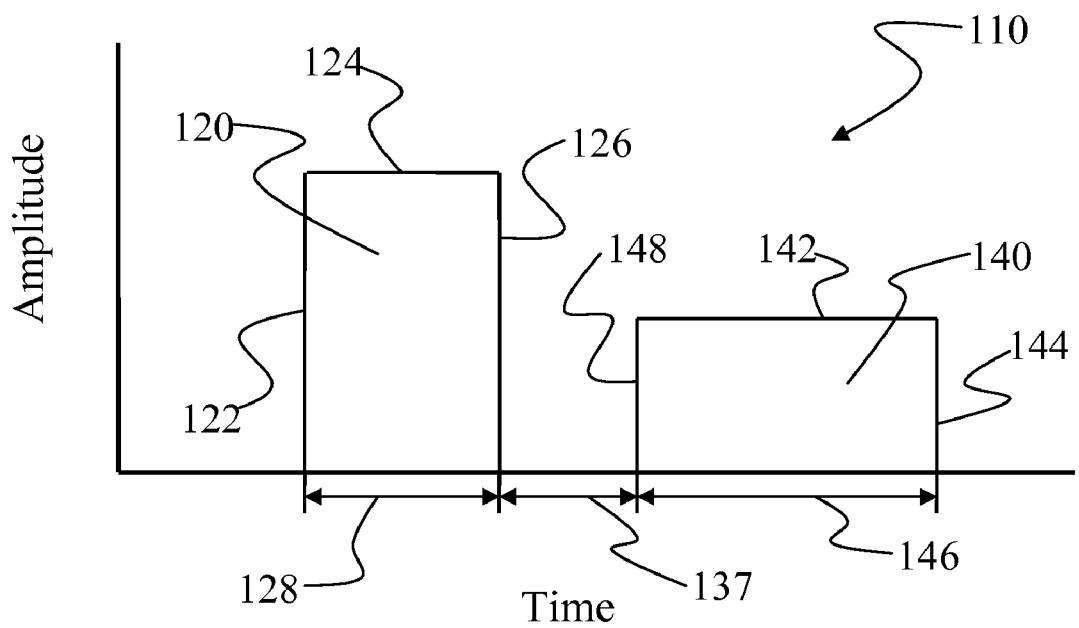
FIG. 9 depicts a programming sequence utilizing two discrete pulses.

Applicant views a programming method in which first trailing edge 26 returns to zero amplitude before application of conditioning waveform 40 as a multiple pulse programming method. In a multiple pulse programming method, two or more pulses are applied to the phase-change material where each pulse begins with the phase-change material in a zero amplitude state, provides energy over a particular time window, and relaxes the phase-change material to a zero amplitude state. In a multiple pulse programming method, the two or more pulses are resolved or separated in time so that each pulse is discrete and non-overlapping with other pulses in a programming sequence. An example of a two-pulse programming sequence is shown in FIG. 9. FIG. 9 includes programming pulse 120 and conditioning pulse 140. Programming pulse 120 includes leading edge 122, plateau 124, trailing edge 126, and has duration 128. Conditioning pulse 140 includes leading edge 148, plateau 142, trailing edge 144, and has duration 146. Programming pulse 120 and conditioning pulse 140 are non-overlapping and resolved in time by time interval 137.

Figure 10:
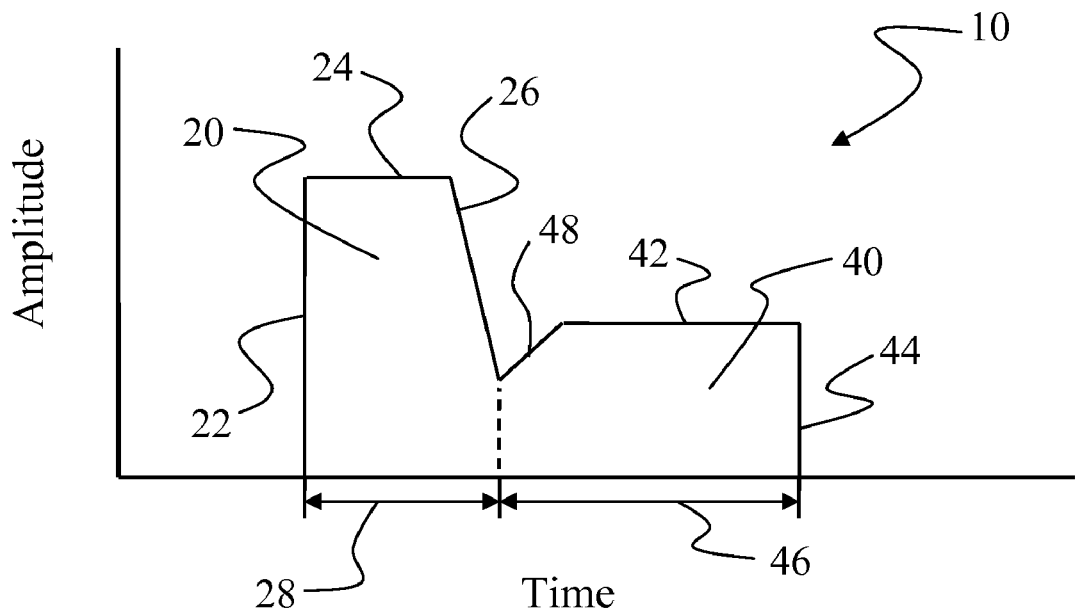
FIG. 10 depicts a transformation pulse that includes a programming waveform and a conditioning waveform, where the conditioning waveform includes a leading edge.

The instant invention extends to transformation pulses having a conditioning waveform that includes a leading edge. FIG. 10, for example, depicts an embodiment of a transformation pulse in which the conditioning waveform includes a leading edge. Second leading edge 48 follows first trailing edge 26 in time. In contrast to FIG. 9, in the embodiment of FIG. 10, programming waveform 20 and conditioning waveform 40 are not resolved in time, but rather occur continuously in time with respect to each other with no intervening time interval such as time interval 37 shown in FIG. 9. In the embodiment of FIG. 10, first trailing edge does not return to zero amplitude. Instead, the decrease in amplitude of programming waveform 20 along first trailing edge 26 is arrested at a non-zero amplitude and transformation pulse 10 continuously proceeds along second leading edge 48 to initiate conditioning waveform 40.

The decrease in amplitude of first trailing edge 26 is sufficient to reduce the current through the phase-change material to a level that maintains a temperature of less than the crystallization temperature. This condition insures that conditioning waveform 40 does not induce a structural transformation of the phase-change material. The purpose of conditioning waveform 40 is to condition the phase-change material, without altering its structural state, to establish a state that is less conducive to resistance drift than the state that would have resulted had first trailing edge 26 been allowed to return to zero amplitude in the absence of conditioning waveform 40. In one embodiment, conditioning waveform 40 anneals the phase-change material at a temperature of less than the crystallization temperature. By way of example, a particular phase-change material in a particular device structure may have a melting temperature of 550° C. and a crystallization temperature of 250° C. If a 6 mA programming waveform amplitude heats the phase-change material to 600° C. in the particular device structure, a conditioning waveform amplitude of 1.5 mA that heats the phase-change material to a temperature of 150° C. anneals the phase-change material without altering its structural state.

In one embodiment, the decrease in the amplitude of first trailing edge 26 is sufficient to maintain a current through the phase-change material that is at or above the holding current (discussed in connection with FIG. 1 hereinabove). In this embodiment, transformation pulse 10 remains in the conductive branch of the I-V plot (see FIG. 1) as it transitions from programming waveform 20 to conditioning waveform 40 so that only a single switching event accompanies application of transformation pulse 10. The programming operation transitions seamlessly into the conditioning operation without returning to the resistive branch of the I-V plot and without subjecting the phase-change material to multiple switching events to accomplish conditioning.

In the case of discrete, time-separated programming and conditioning pulses (as in FIG. 9), multiple switching events occur. An initial switching of the phase-change material to the conductive branch of the I-V plot occurs upon application of the programming pulse, but the phase-change material returns to the resistive branch as the amplitude of first trailing edge 26 returns to zero. A subsequent switching event occurs upon application of a time-separated conditioning pulse. (Although it is possible to remain on the resistive branch to pass current through the phase-change material without inducing switching, the magnitudes of currents associated with the resistive branch are too low to provide sufficient heating to condition the phase-change material in an effective way. The higher currents required for effective conditioning require a switching of the phase-change material to the conductive branch.)

Example 1

In this example, the beneficial effect of the instant transformation pulse on resistance drift is demonstrated. Specifically, the resistance drift of a phase-change memory device was measured based on programming in two ways. In a first set of experiments, the device was programmed according to the prior art to various resistance states using a programming pulse that lacked the conditioning waveform of the instant invention. The resistance of the different programmed states ranged between 10 kΩ and about 1.3 MΩ. A separate programming pulse was used to obtain each programmed resistance state, where the duration of each programming pulse was 200 ns and the voltage of each programming pulse was varied according to the targeted resistance of the programmed state. The pulse voltage was in the range from ~1V to ~3.5V. The drift in resistance of each of the different resistance states was monitored and modeled with the power law formula described hereinabove to determine the drift exponent $d_0$ as a function of initial programmed resistance.

In a second set of experiments, the device was programmed according to the instant invention with a transformation pulse that included a programming waveform and a conditioning waveform. Several experiments were performed using transformation pulses having different characteristics. The programming waveform of each transformation pulse had a programming duration of 200 ns, while a series of programming voltages coinciding with those used to achieve the different initial resistance states in the first set of experiments was employed. A series of conditioning waveforms was also employed in the second set of experiments. The conditioning waveform of each transformation pulse had an amplitude of 1 volt, where the duration of the conditioning waveform was varied between 1 μs and 10 μs in separate trials.

In both sets of experiments, the device was subject to a pre-conditioning sequence of pulses before programming to a particular resistance state. The pre-conditioning pulses included a pre-conditioning set sweep pulse followed by a preconditioning reset pulse. The pre-conditioning pulses were applied to insure a consistent starting point for each programming event so that the state of the device before programming was the same for each programming event.

Figure 11:
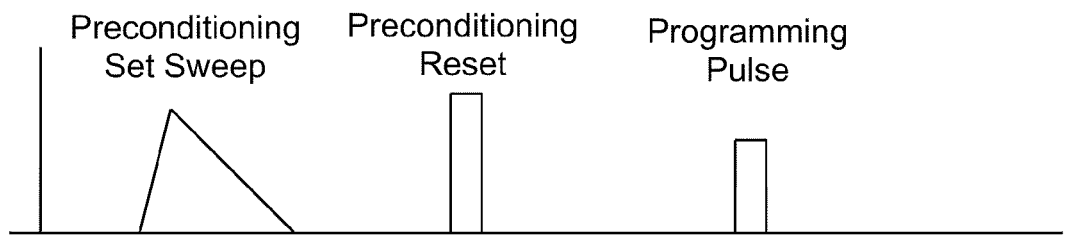
FIG. 11 shows resistance drift for a phase-change memory device programmed to different initial resistance values, where programming is accomplished by a programming waveform according to the prior art with no conditioning waveform.
Figure 11:
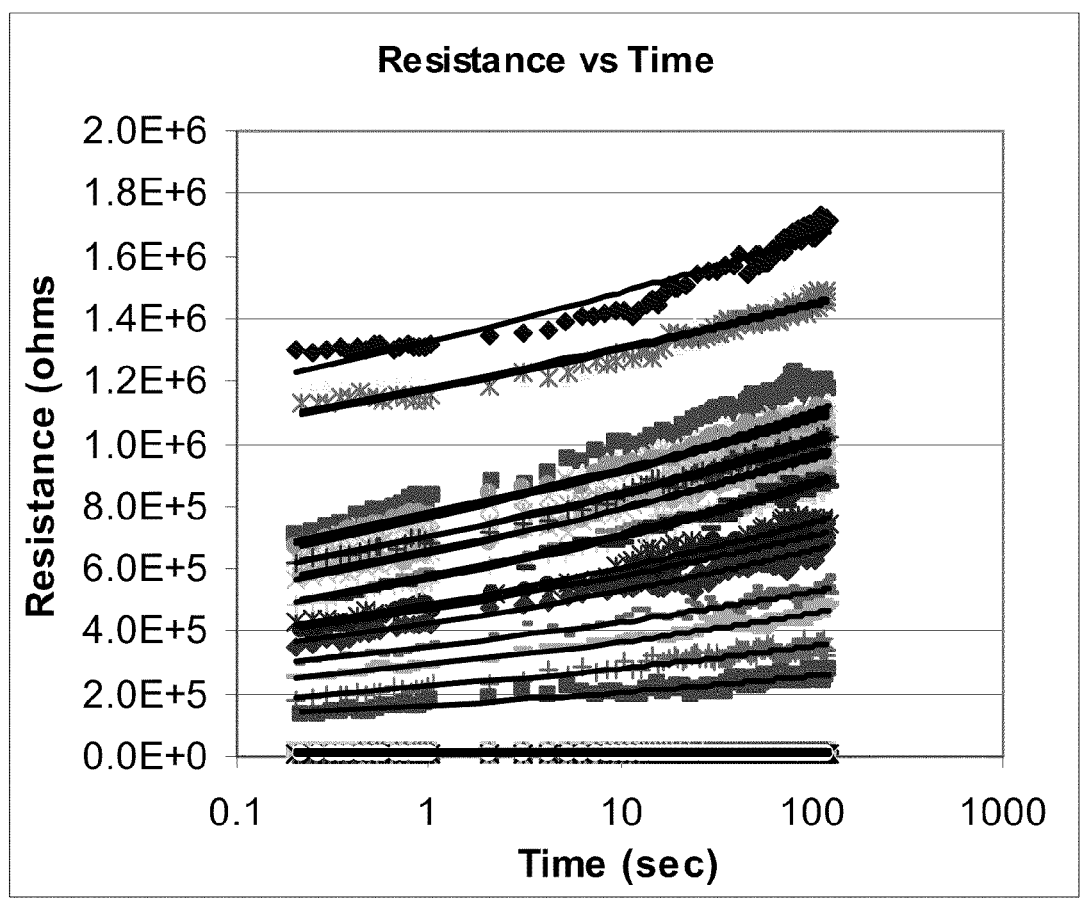

FIG. 11 shows the variation in resistance of several states for the device upon programming according to the prior art. The pulse sequence is depicted schematically in the upper portion of the figure. Each data curve presented in FIG. 11 shows the resistance variation of a particular resistance state, where the initial (programmed) resistance of the state is the resistance shown at the shortest time for each data curve. The resistance variation of states having initial resistances between about 10 kΩ and 1.3 MΩ were considered and the drift of each state was measured over a 100 second time interval. The upward trend in the data curves is a manifestation of drift.

Figure 12:
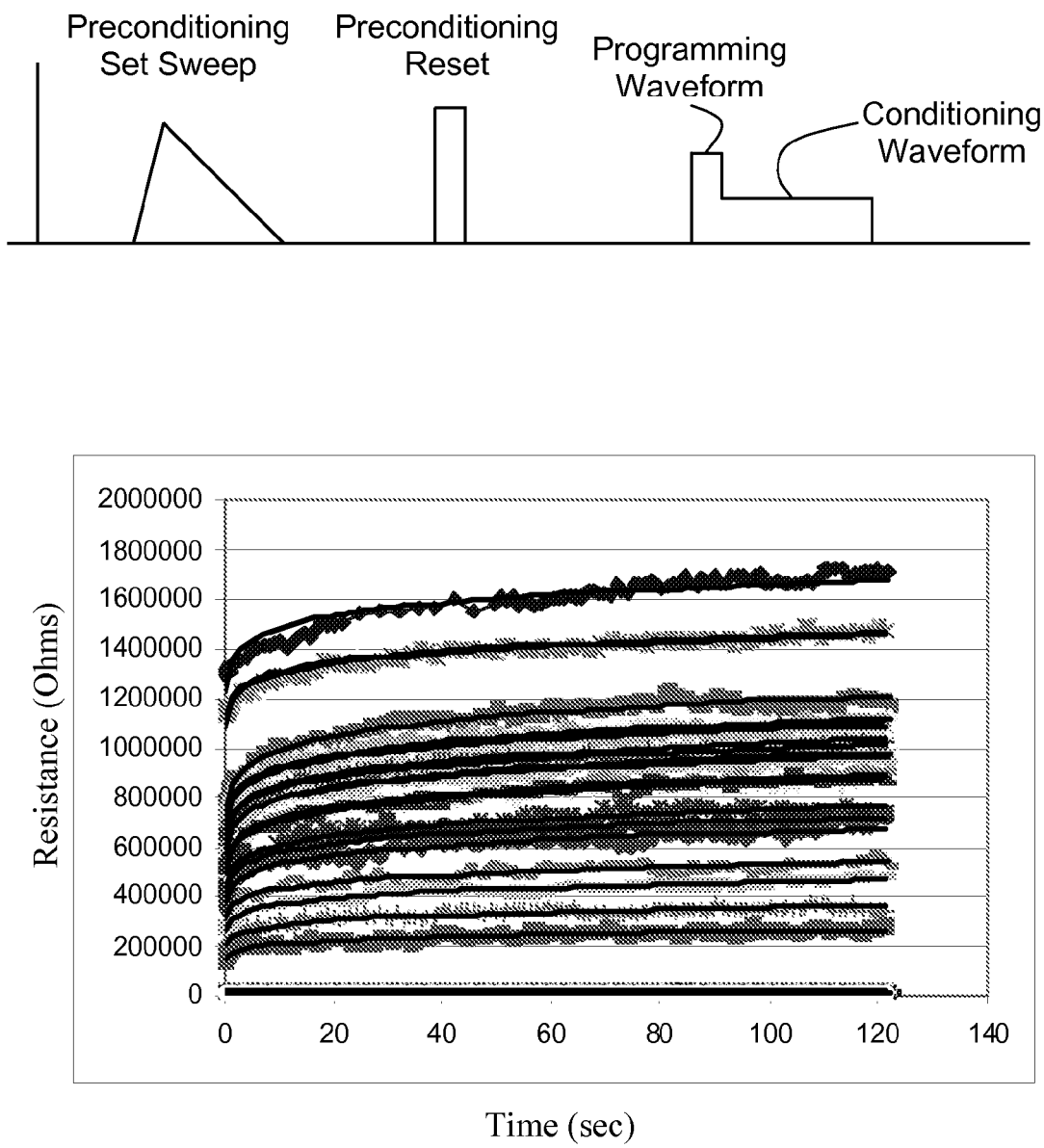
FIG. 12 shows resistance drift for a phase-change memory device programmed to different initial resistance values, where programming is accomplished by a programming waveform with a conditioning waveform in accordance with one embodiment of the instant invention.

FIG. 12 shows the variation in resistance for several states of the device upon programming according to the instant invention. The pulse sequence is depicted schematically in the upper portion of the figure. The noteworthy distinction relative to the pulse sequence of FIG. 11 is inclusion of the instant conditioning waveform. As in FIG. 11, each data curve of FIG. 12 shows the resistance drift of a particular programmed state over a 100 second time interval. The different data curves correspond to states programmed to different initial resistances, where the initial resistance is the resistance at the short time end point of the data curve. Programmed states having initial resistances between about 10 kΩ and 1.3 MΩ were considered. As in FIG. 11, the data curves shown in FIG. 12 exhibit an upward shift in resistance over time. The magnitude of the upward shift in resistance, however, is less pronounced in FIG. 12 than in FIG. 11.

To quantitatively compare the extent of resistance drift for the different pulse conditions shown in FIG. 11 and FIG. 12, each data curves was fit with the power law formula described hereinabove and the drift exponent of each data curve was obtained. The results of the fits are shown as continuous lines superimposed over the data presented in FIG. 11 and FIG. 12. The drift exponents obtained from the data fits are plotted in FIG. 13 as a function of the initial resistance of the programmed states. The data points depicted as diamond symbols and labeled "Vapp 200 ns" in the legend of FIG. 13 correspond to results obtained from the data curves of FIG. 11. The remaining data points correspond to results obtained from the data curves of FIG. 12 and similar data curves obtained for conditioning waveforms of other durations not shown in FIG. 12. The general trends associated with the drift exponent for the experiments with and without the instant conditioning waveform are indicated by the solid curves shown in FIG. 13.

Figure 13:
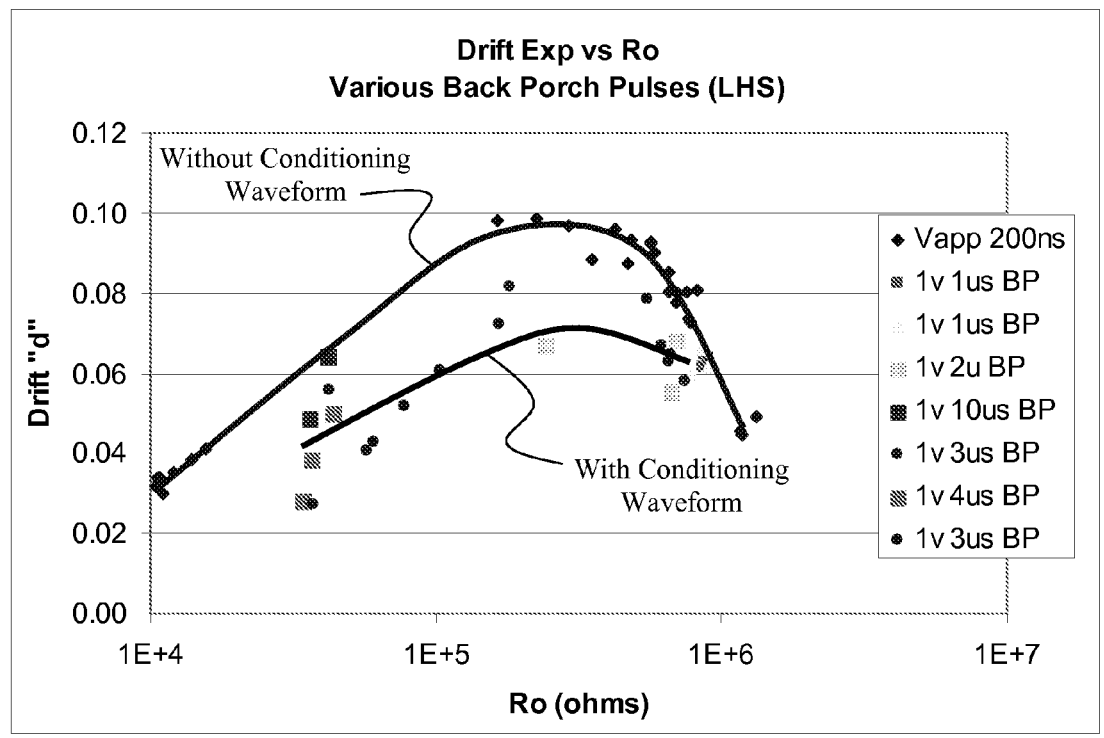
FIG. 13 compares the variation of drift coefficient as a function of the initial resistance of a phase-change memory device for programming according to the prior art and programming using the transformation pulse of the instant invention.

The fit results for the experiments completed without the conditioning waveform show an increase in drift exponent d with increasing initial state resistance $R_0$ between 10 kΩ and about 500 kΩ and a decrease with increasing initial state resistance above about 500 kΩ. A similar trend was observed for the experiments completed with the conditioning waveform. The noteworthy feature of FIG. 13 is that the drift exponent is noticeably reduced when the conditioning waveform is utilized in the pulsing scheme. The reduced drift exponent is observed over states encompassing a wide range of initial resistance value. The experiments of this example show that utilization of a transformation pulse that includes a conditioning waveform in addition to a programming waveform is effective at reducing resistance drift.

Those skilled in the art will appreciate that the methods and designs described above have additional applications and that the relevant applications are not limited to those specifically recited above. Also, the present invention may be embodied in other specific forms without departing from the essential characteristics as described herein. The embodiments described above are to be considered in all respects as illustrative only and not restrictive in any manner.

We claim:

1. A method of programming a phase-change material comprising:

providing a transformation pulse; said transformation pulse including a programming waveform and a conditioning waveform; said programming waveform having a first leading edge and a first trailing edge, said first leading edge increasing in amplitude from an initial amplitude to a first peak amplitude, said first trailing edge decreasing in amplitude from said first peak amplitude; said programming waveform providing energy to said phase-change material in an amount sufficient to heat said phase-change material to a temperature greater than or equal to its crystallization temperature, said programming waveform increasing the amorphous phase volume fraction of said phase-change material; said conditioning waveform having a second peak amplitude, and a second trailing edge; said conditioning waveform initiating before termination of said amplitude of said first trailing edge decreases to said initial amplitude of said first leading edge; said conditioning waveform providing energy to said phase-change material in an amount sufficient to heat said phase-change material to a temperature greater than the ambient temperature and less than said crystallization temperature.

2. The method of claim 1, wherein said transformation pulse is an electrical pulse.

3. The method of claim 2, wherein said electrical pulse is a current pulse.

4. The method of claim 2, wherein said electrical pulse causes a first electrical current to pass through said phase-change material during said programming waveform, said first electrical current providing said energy sufficient to heat said phase-change material to a temperature greater than or equal to its crystallization temperature, said electrical pulse further causing a second electrical current to pass through said phase-change material during said conditioning waveform, said second electric current providing said energy sufficient to heat said phase-change material to a temperature greater than the ambient temperature and less than said crystallization temperature.

5. The method of claim 4, wherein said second electric current is greater than or equal to a holding current of said phase-change material.

6. The method of claim 4, wherein said first electric current heats said phase-change material to a temperature greater than or equal to its melting temperature.

7. The method of claim 1, wherein said programming waveform resets said phase-change material.

8. The method of claim 2, wherein said conditioning waveform of said electrical pulse anneals said phase-change material.

9. The method of claim 2, wherein said programming waveform of said electrical pulse produces internal stresses within said phase-change material and said conditioning waveform of said electrical pulse at least partially relaxes said internal stresses.

10. The method of claim 2, wherein said electrical pulse switches said phase-change material from a resistive state to a conductive state, said switching occurring only once.

11. The method of claim 10, wherein said programming waveform induces said switching of said phase-change material.

12. The method of claim 1, wherein said first leading edge is sloped.

13. The method of claim 1, wherein said first trailing edge is sloped.

14. The method of claim 1, wherein said programming waveform includes a plateau, said plateau including said first peak amplitude.

15. The method of claim 14, wherein said plateau persists over a period of time, the amplitude of said plateau being constant over said period of time.

16. A method of programming a phase-change material comprising:

providing a transformation pulse; said transformation pulse including a programming waveform and a conditioning waveform; said programming waveform having a first leading edge and a first trailing edge, said first leading edge increasing in amplitude from an initial amplitude to a first peak amplitude, said first trailing edge decreasing in amplitude from said first peak amplitude, said phase-change material quenching to an amorphous state during said first trailing edge; said programming waveform providing energy to said phase-change material in an amount sufficient to heat said phase-change material to a temperature greater than or equal to its crystallization temperature; said conditioning waveform having a second peak amplitude, and a second trailing edge; said conditioning waveform initiating before said amplitude of said first trailing edge decreases to said initial amplitude of said first leading edge; said conditioning waveform providing energy to said phase-change material in an amount sufficient to heat said phase-change material to a temperature greater than the ambient temperature and less than said crystallization temperature.

17. A method of programming a phase-change material comprising:

providing a transformation pulse; said transformation pulse including a programming waveform and a conditioning waveform; said programming waveform having a first leading edge and a first trailing edge, said first leading edge increasing in amplitude from an initial amplitude to a first peak amplitude, said first trailing edge decreasing in amplitude from said first peak amplitude; said programming waveform providing energy to said phase-change material in an amount sufficient to heat said phase-change material to a temperature greater than or equal to its melting temperature; said conditioning waveform having a second peak amplitude, and a second trailing edge; said conditioning waveform initiating before said amplitude of said first trailing edge decreases to said initial amplitude of said first leading edge; said conditioning waveform providing energy to said phase-change material in an amount sufficient to heat said phase-change material to a temperature greater than the ambient temperature and less than said crystallization temperature.

18. The method of claim 1, wherein said programming waveform is a square waveform.

19. The method of claim 1, wherein said programming waveform is a trapezoidal waveform.

20. The method of claim 1, wherein said conditioning waveform anneals said phase-change material.

21. The method of claim 1, wherein said conditioning waveform includes a plateau, said plateau including said second peak amplitude.

22. The method of claim 21, wherein said plateau persists over a period of time, the amplitude of said plateau being constant over said period of time.

23. The method of claim 1, wherein said conditioning waveform further includes a second leading edge, said second leading edge preceding said second peak amplitude, said second leading edge initiating before said amplitude of said first trailing edge decreases to said initial amplitude of said first leading edge.

24. The method of claim 1, wherein said second peak amplitude is greater than or equal to the amplitude of said programming waveform upon conclusion of said first trailing edge.

25. The method of claim 1, wherein said programming waveform persists over a first time window, said first time window extending from initiation of said first leading edge until initiation of said conditioning waveform, and said conditioning waveform persists over a second time window, said second time window extending from initiation of said conditioning waveform until termination of said second trailing edge, said second time window being longer than said first time window.

26. The method of claim 1, wherein said programming waveform transforms said phase-change material to a first resistance state, said first resistance state having a first drift exponent, and wherein said conditioning waveform reduces said first drift exponent.

27. The method of claim 26, wherein said conditioning waveform reduces said first drift exponent by a factor of at least two.

28. The method of claim 24, wherein said second peak amplitude is greater than the amplitude of said programming waveform upon conclusion of said first trailing edge.

29. The method of claim 16, wherein said transformation pulse is an electrical pulse.

30. The method of claim 29, wherein said electrical pulse causes a first electrical current to pass through said phase-change material during said programming waveform, said first electrical current providing said energy sufficient to heat said phase-change material to a temperature greater than or equal to its crystallization temperature, said electrical pulse further causing a second electrical current to pass through said phase-change material during said conditioning waveform, said second electric current providing said energy sufficient to heat said phase-change material to a temperature greater than the ambient temperature and less than said crystallization temperature.

31. The method of claim 30, wherein said second electric current is greater than or equal to a holding current of said phase-change material.

32. The method of claim 30, wherein said first electric current heats said phase-change material to a temperature greater than or equal to its melting temperature.

33. The method of claim 16, wherein said programming waveform resets said phase-change material.

34. The method of claim 29, wherein said conditioning waveform of said electrical pulse anneals said phase-change material.

35. The method of claim 29, wherein said electrical pulse switches said phase-change material from a resistive state to a conductive state, said switching occurring only once.

36. The method of claim 16, wherein said programming waveform includes a plateau, said plateau including said first peak amplitude.

37. The method of claim 16, wherein said conditioning waveform anneals said phase-change material.

38. The method of claim 16, wherein said conditioning waveform includes a plateau, said plateau including said second peak amplitude.

39. The method of claim 16, wherein said conditioning waveform further includes a second leading edge, said second leading edge preceding said second peak amplitude, said second leading edge initiating before said amplitude of said first trailing edge decreases to said initial amplitude of said first leading edge.

40. The method of claim 16, wherein said second peak amplitude is greater than or equal to the amplitude of said programming waveform upon conclusion of said first trailing edge.

41. The method of claim 40, wherein said second peak amplitude is greater than the amplitude of said programming waveform upon conclusion of said first trailing edge.

42. The method of claim 16, wherein said programming waveform persists over a first time window, said first time window extending from initiation of said first leading edge until initiation of said conditioning waveform, and said conditioning waveform persists over a second time window, said second time window extending from initiation of said conditioning waveform until termination of said second trailing edge, said second time window being longer than said first time window.

43. The method of claim 16, wherein said programming waveform transforms said phase-change material to a first resistance state, said first resistance state having a first drift exponent, and wherein said conditioning waveform reduces said first drift exponent.

44. The method of claim 17, wherein said transformation pulse is an electrical pulse.

45. The method of claim 44, wherein said electrical pulse causes a first electrical current to pass through said phase-change material during said programming waveform, said first electrical current providing said energy sufficient to heat said phase-change material to a temperature greater than or equal to its melting temperature, said electrical pulse further causing a second electrical current to pass through said phase-change material during said conditioning waveform, said second electric current providing said energy sufficient to heat said phase-change material to a temperature greater than the ambient temperature and less than said crystallization temperature.

46. The method of claim 45, wherein said second electric current is greater than or equal to a holding current of said phase-change material.

47. The method of claim 17, wherein said programming waveform resets said phase-change material.

48. The method of claim 44, wherein said conditioning waveform of said electrical pulse anneals said phase-change material.

49. The method of claim 44, wherein said electrical pulse switches said phase-change material from a resistive state to a conductive state, said switching occurring only once.

50. The method of claim 17, wherein said programming waveform includes a plateau, said plateau including said first peak amplitude.

51. The method of claim 17, wherein said conditioning waveform anneals said phase-change material.

52. The method of claim 17, wherein said conditioning waveform includes a plateau, said plateau including said second peak amplitude.

53. The method of claim 17, wherein said conditioning waveform further includes a second leading edge, said second leading edge preceding said second peak amplitude, said second leading edge initiating before said amplitude of said first trailing edge decreases to said initial amplitude of said first leading edge.

54. The method of claim 17, wherein said second peak amplitude is greater than or equal to the amplitude of said programming waveform upon conclusion of said first trailing edge.

55. The method of claim 54, wherein said second peak amplitude is greater than the amplitude of said programming waveform upon conclusion of said first trailing edge.

56. The method of claim 17, wherein said programming waveform persists over a first time window, said first time window extending from initiation of said first leading edge until initiation of said conditioning waveform, and said conditioning waveform persists over a second time window, said second time window extending from initiation of said conditioning waveform until termination of said second trailing edge, said second time window being longer than said first time window.

57. The method of claim 17, wherein said programming waveform transforms said phase-change material to a first resistance state, said first resistance state having a first drift exponent, and wherein said conditioning waveform reduces said first drift exponent.

* * * * *